(12) United States Patent
Cook

(10) Patent No.: US 11,085,955 B2
(45) Date of Patent: *Aug. 10, 2021

(54) ENERGY METERING SYSTEM WITH TEMPERATURE MONITORING BASED ON CIRCUIT BREAKERS OF POWER PANEL LIKELY TO TRIP

(71) Applicant: Veris Industries, LLC, Tualatin, OR (US)

(72) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/613,234

(22) PCT Filed: May 17, 2018

(86) PCT No.: PCT/US2018/033119
§ 371 (c)(1),
(2) Date: Nov. 13, 2019

(87) PCT Pub. No.: WO2018/213536
PCT Pub. Date: Nov. 22, 2018

(65) Prior Publication Data
US 2020/0142695 A1 May 7, 2020
US 2021/0042113 A9 Feb. 11, 2021
US 2021/0173645 A9 Jun. 10, 2021

Related U.S. Application Data

(63) Continuation of application No. 15/792,573, filed on Oct. 24, 2017, now Pat. No. 10,705,126.

(Continued)

(51) Int. Cl.
*G01R 21/14* (2006.01)
*G01R 21/06* (2006.01)
(Continued)

(52) U.S. Cl.
CPC ............... *G01R 21/14* (2013.01); *G01D 3/08* (2013.01); *G01D 4/002* (2013.01); *G01D 4/004* (2013.01);
(Continued)

(58) Field of Classification Search
CPC ............... G06F 9/3004; G06F 9/30047; G06F 9/30076; G06F 9/44; G06F 12/084; G06F 12/0875; G06F 12/1483
See application file for complete search history.

(56) References Cited

U.S. PATENT DOCUMENTS 1,100,171 A 6/1914 Brown
1,455,263 A 5/1923 Oberfell
(Continued)

FOREIGN PATENT DOCUMENTS

| EP | 1531334 A2 | 5/2005 |
|---|---|---|
| WO | 2016013021 A1 | 1/2016 |
| WO | 2016176315 A1 | 11/2016 |

OTHER PUBLICATIONS

International Search Report prepared by the US Patent and Trademark Office for PCT/US2018/033119, dated Aug. 3, 2018, 2 pages.
(Continued)

*Primary Examiner* — Tammara R Peyton
(74) *Attorney, Agent, or Firm* — Chernoff, Vilhauer, McClung & Stenzel, LLP

(57) ABSTRACT

A system for energy metering with temperature monitoring.

20 Claims, 15 Drawing Sheets

Related U.S. Application Data

(60) Provisional application No. 62/508,732, filed on May 19, 2017.

(51) Int. Cl.

| | | |
|---|---|---|
| *G01D 4/00* | (2006.01) | |
| *G01R 21/133* | (2006.01) | |
| *G01R 22/06* | (2006.01) | |
| *G01R 22/10* | (2006.01) | |
| *G01R 19/32* | (2006.01) | |
| *G01D 3/08* | (2006.01) | |
| *G06F 9/30* | (2018.01) | |
| *G06F 9/44* | (2018.01) | |
| *G06F 12/084* | (2016.01) | |
| *G06F 12/0875* | (2016.01) | |
| *G06F 12/14* | (2006.01) | |

(52) U.S. Cl.
CPC ............ *G01R 19/32* (2013.01); *G01R 21/06* (2013.01); *G01R 21/1333* (2013.01); *G01R 22/061* (2013.01); *G01R 22/10* (2013.01); *G06F 9/3004* (2013.01); *G06F 9/30047* (2013.01); *G06F 9/30076* (2013.01); *G06F 9/44* (2013.01); *G06F 12/084* (2013.01); *G06F 12/0875* (2013.01); *G06F 12/1483* (2013.01); *G06F 2212/452* (2013.01)

(56) References Cited

U.S. PATENT DOCUMENTS

| | | |
|---|---|---|
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa |
| 2,412,782 A | 12/1946 | Palmer |
| 2,428,613 A | 10/1947 | Boyajian |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Ebert |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Tipton et al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,107,447 A * | 4/1992 | Ozawa ............... H02B 13/065 702/58 |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah |
| 5,365,462 A | 11/1994 | McBean |
| D354,945 S | 1/1995 | Dellavecchia et al. |

(56) References Cited

U.S. PATENT DOCUMENTS

| | | |
|---|---|---|
| 5,384,712 A | 1/1995 | Oravetz et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | Carter |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,312,964 B2 | 12/2007 | Tchernobrivets |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,453,267 B2 | 11/2008 | Westbrock, Jr. et al. |
| 7,474,088 B2 | 1/2009 | Bowman et al. |
| 7,652,871 B2 | 1/2010 | Caggiano et al. |
| 8,085,055 B2 | 12/2011 | Rupert |
| 8,193,803 B2 | 6/2012 | Bose et al. |
| 8,212,548 B2 | 7/2012 | Parker et al. |
| 8,212,549 B2 | 7/2012 | McNulty et al. |
| 8,294,453 B2 | 10/2012 | Bowman |
| 8,310,370 B1 | 11/2012 | Williams, Jr. et al. |
| 8,405,383 B2 | 3/2013 | Agrawal et al. |
| 8,421,443 B2 | 4/2013 | Bitsch et al. |
| 8,610,438 B1 | 12/2013 | Sykora et al. |
| 8,612,792 B2 | 12/2013 | Fu et al. |
| 8,837,118 B2 | 9/2014 | McGrail |
| 8,878,475 B2 | 11/2014 | Bonvin et al. |
| 8,964,360 B2 | 2/2015 | Trout |
| 8,988,062 B2 | 3/2015 | Sykora et al. |
| 9,146,264 B2 | 9/2015 | Cook |
| 9,329,659 B2 | 5/2016 | Cook |
| 9,395,344 B2 | 7/2016 | Sheley |
| 9,424,975 B2 | 8/2016 | Cook et al. |
| 9,577,443 B2 | 2/2017 | Gach et al. |
| 9,588,148 B2 | 3/2017 | Cook et al. |
| 9,607,749 B2 | 3/2017 | Cook et al. |
| 10,705,126 B2 * | 7/2020 | Cook .................. G06F 9/44 |
| 2001/0040446 A1 | 11/2001 | Lapinksi |
| 2004/0227503 A1 | 11/2004 | Bowman |
| 2005/0240362 A1 | 10/2005 | Randall |
| 2006/0085144 A1 | 4/2006 | Slota et al. |
| 2006/0103548 A1 | 5/2006 | Borkowski et al. |
| 2006/0164096 A1 | 7/2006 | Kwon |
| 2006/0181242 A1 | 8/2006 | Freed |
| 2006/0238932 A1 | 10/2006 | Westbrock et al. |
| 2007/0153438 A1 | 7/2007 | Caggiano et al. |
| 2008/0012666 A1 | 1/2008 | Davison et al. |
| 2008/0077336 A1 | 3/2008 | Fernandes |
| 2008/0303511 A1 | 12/2008 | Grno |
| 2009/0115400 A1 | 5/2009 | Hunter |
| 2009/0115620 A1 | 5/2009 | Hunter |
| 2009/0295370 A1 | 6/2009 | Parker |
| 2010/0117626 A1 | 5/2010 | Wertz et al. |
| 2010/0176960 A1 | 7/2010 | Bitsch |
| 2010/0207604 A1 | 8/2010 | Bitsch |
| 2010/0235122 A1 | 9/2010 | McCrea |
| 2010/0308792 A1 | 12/2010 | Rupert |
| 2011/0098985 A1 | 4/2011 | Lawson |
| 2011/0181124 A1 | 7/2011 | Uesaka |

(56) References Cited

U.S. PATENT DOCUMENTS

| 2012/0112681 | A1 | 5/2012 | Bonvin |
| 2012/0194344 | A1 | 8/2012 | McNamara et al. |
| 2012/0221278 | A1 | 8/2012 | Cook |
| 2012/0235667 | A1 | 9/2012 | Agrawal et al. |
| 2013/0024714 | A1 | 1/2013 | Fu et al. |
| 2013/0027818 | A1 | 1/2013 | McGrail |
| 2013/0144545 | A1 | 6/2013 | Fu et al. |
| 2013/0294014 | A1 | 11/2013 | Irons |
| 2014/0239964 | A1 | 8/2014 | Gach et al. |
| 2015/0028848 | A1 | 1/2015 | Lynch et al. |
| 2015/0276877 | A1 | 10/2015 | Biswas et al. |
| 2015/0293549 | A1 | 10/2015 | Lal et al. |

OTHER PUBLICATIONS

Written Opinion prepared by the US Patent and Trademark Office for PCT/US2018/033119, dated Aug. 3, 2018, 6 pages.

\* cited by examiner

ENERGY METERING SYSTEM WITH TEMPERATURE MONITORING BASED ON CIRCUIT BREAKERS OF POWER PANEL LIKELY TO TRIP

CROSS-REFERENCE TO RELATED APPLICATIONS

This application claims the benefit of U.S. Provisional App. No. 62/508,732 filed May 19, 2017.

BACKGROUND OF THE INVENTION

The present invention relates to an energy metering system with temperature monitoring.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Digital branch current monitors may incorporate data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP), For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

DETAILED DESCRIPTION OF PREFERRED EMBODIMENTS

Figure 1:
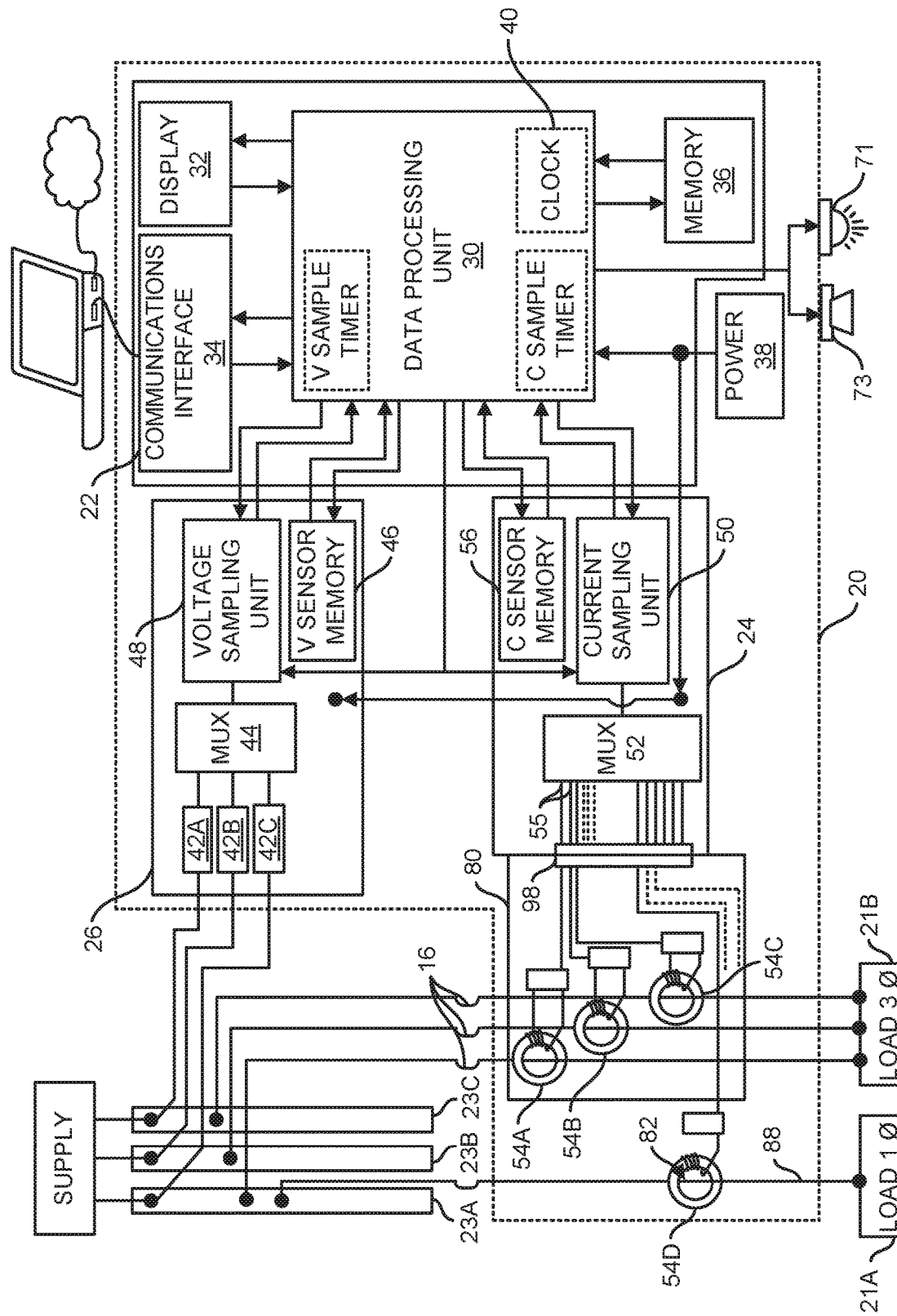
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The branch current monitor 20 is preferably housed in a housing and/or the data processing module 22 is preferably housed in a housing and/or the current module 24 is preferably housed in a housing and/or the voltage module is preferably housed in a housing. In some embodiments, the branch current monitor and/or the data processing module and/or the current module and/or the voltage module includes one or more connectors suitable to detachably connect a separate power meter to sense electrical properties of the branch current monitor and/or the data processing module and/or the current module and/or the voltage module. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meters output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 2:
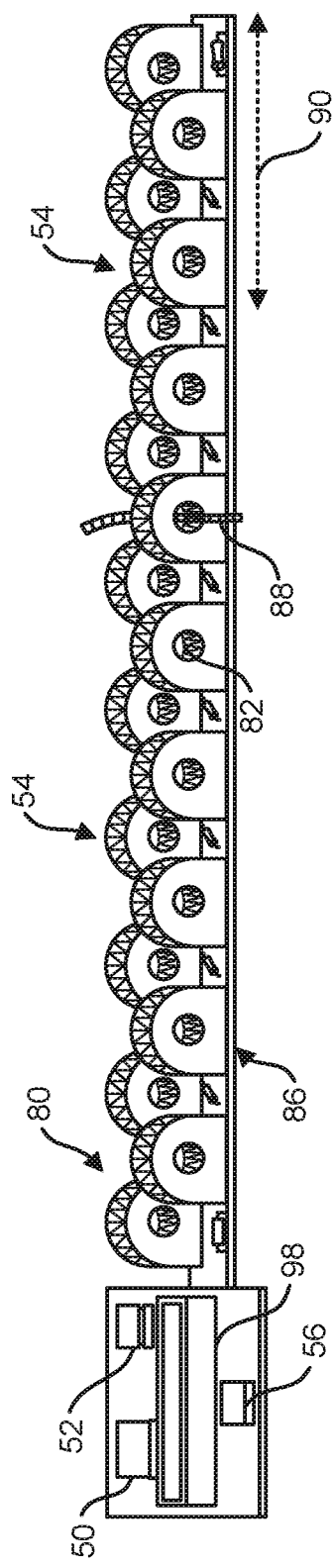
FIG. 2 is a perspective view of a current transformer strip for a branch current monitor.
Figure 3:
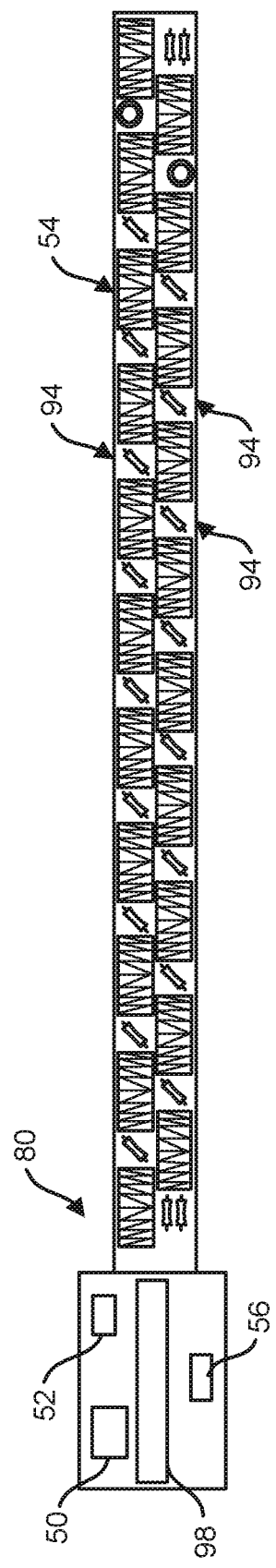
FIG. 3 is a top view of the current transformer strip of FIG. 2.
Figure 4:
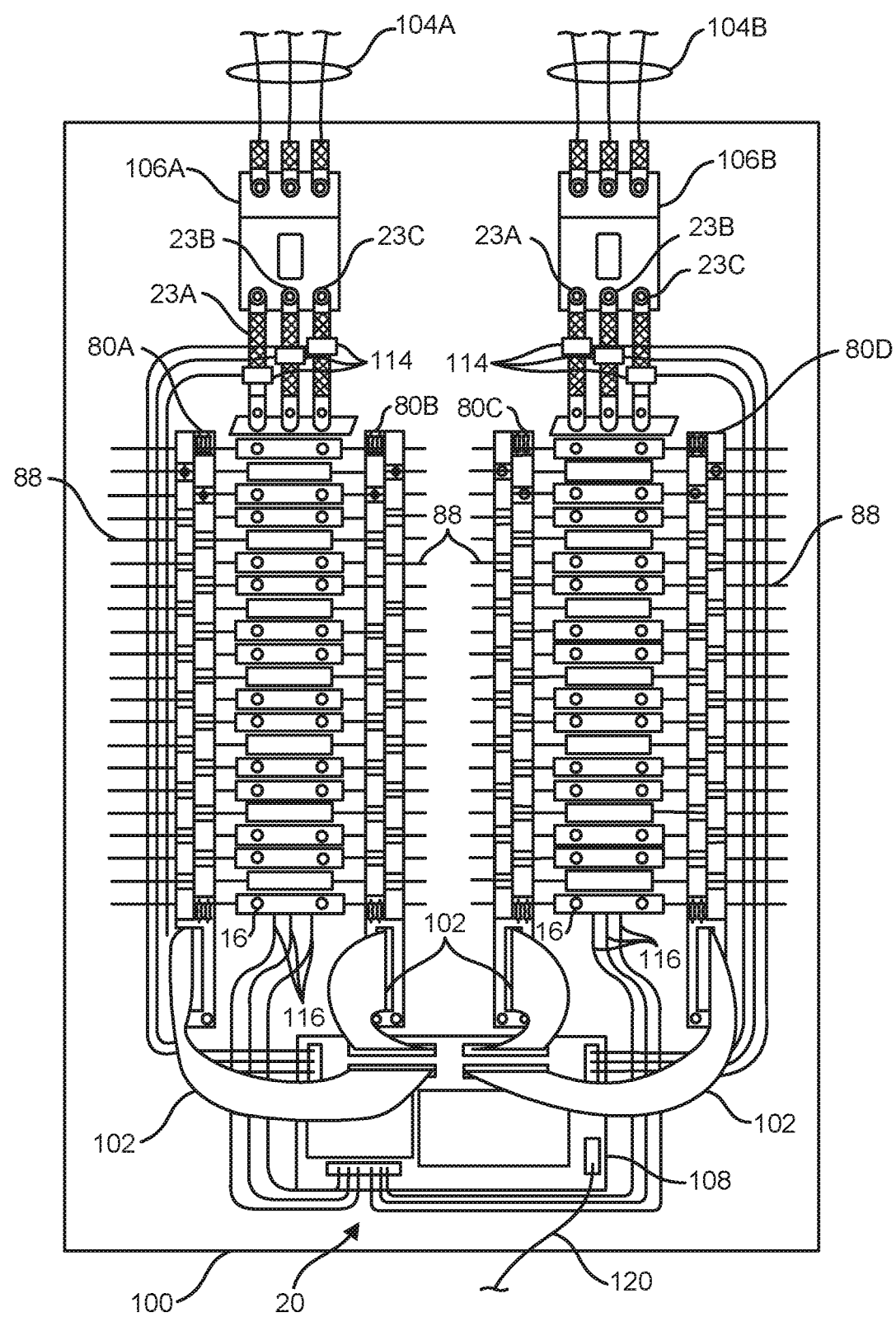
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module, Improper connection or installation of an incompatible transducer strip may cause illumination of signaling lights or a warning message on the meter's display. In addition, the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interlace or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network. The main acquisition circuit board 108 is preferably housed in a housing. In some embodiments, the main acquisition circuit board 108 includes one or more connectors suitable to detachably connect a separate power meter to sense electrical properties of the current and/or voltage being sensed. The strips or support units may be housed in a housing, in whole or in part. In some embodiments, the strips or support units includes one or more connectors suitable to detachably connect a separate power meter to sense electrical properties of the current and/or voltage being sensed.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The main acquisition board 108 is preferably housed in a housing. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
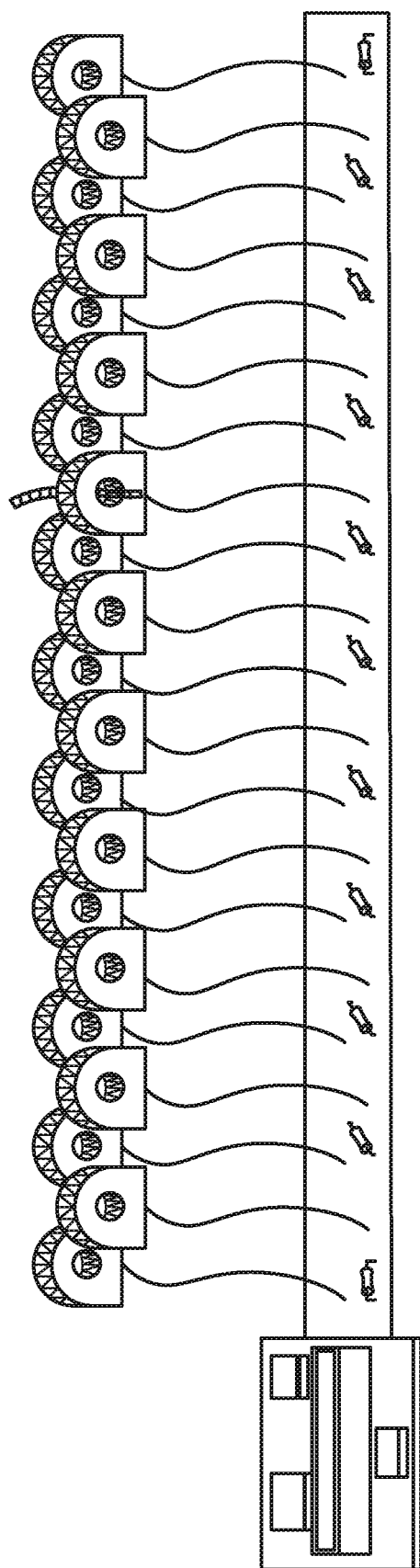
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board. All or a portion of the strip unit is preferably housed in a housing. The strips unit may be housed in a housing, in whole or in part. In some embodiments, the strip unit includes one or more connectors suitable to detachably connect a separate power meter to sense electrical properties of the strip unit.

Figure 6:
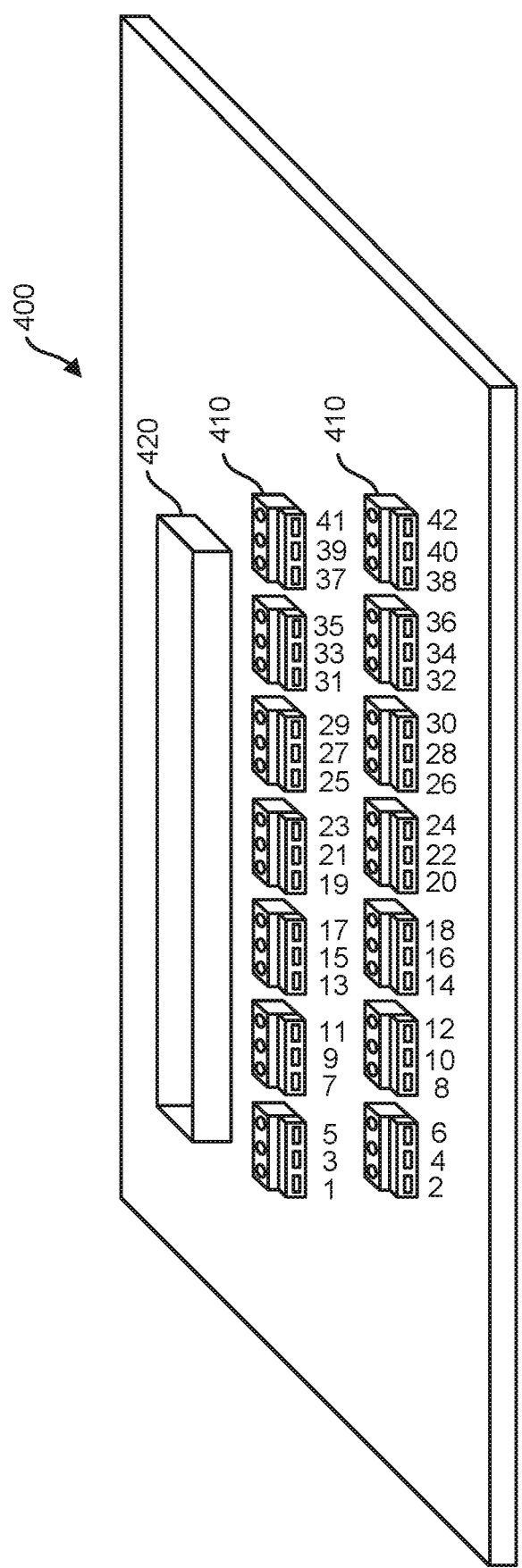
FIG. 6 illustrates a view of a connector board for a branch current monitor with a temperature sensor.

Referring to FIG. 6, another embodiment includes a set of one or more connector boards 400 in addition to or as an alternative to the strip units. Each of the connector boards may include a set of connectors 410 that may be used to interconnect a current transformer thereto. Each of the connector boards may include a connector 420 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

It is to be understood that the current sensor may be any suitable technique, including non-toroidal cores.

One or more of the circuit breakers along the length of the power panel has a tendency to trip if the current levels and/or power levels are too high for the circuit breaker, thus protecting the respective loads from damage. Typically, the tripping of the circuit breakers occurs as a result of the load consuming more power than the rating of the corresponding circuit breaker(s). When the circuit breaker trips a signal is typically received by the monitoring system as a result of a change in the sensed current levels in the power cable indicating the occurrence of the tripped circuit breaker and/or failure of the load. When this occurs, a technician is dispatched to the circuit breaker and/or the load to reset the circuit and repair the load, as needed. However, during this time until the resetting of the circuit breaker and/or repair of the failed load, the operation of the load is compromised. In the case of computer servers in a data center, where continuous up time for the computer servers is of a paramount concern, it is desirable to predict if the circuit breaker is likely to trip so that preventive measures may be taken to avoid such an occurrence.

In general, the circuit breaker operates as a switch that protects the wiring and the load from overheating and shuts off the electricity to the load. Many circuit breakers include a heating element that heats a thermostat inside the breaker as an estimation of the power being provided to the load. While providing a sufficiently large amount of power to the load will trigger the circuit breaker, another source of heat that could trigger the circuit breaker is a loose wire connection to the circuit breaker. The loose wire connection builds up additional heat in the circuit breaker, generally as a result of small sparks that form between the surfaces of the loose wire connection. If a loose wire connection to the circuit breaker can be sensed, as a result of the additional heat being generated by the loose connection, then a technician will be able to properly secure the wire to the circuit breaker so that the circuit breaker does not subsequently trip as a result of the loose connection, and otherwise power is not unnecessarily interrupted to the load, such as one or more servers of a data center.

Figure 7:
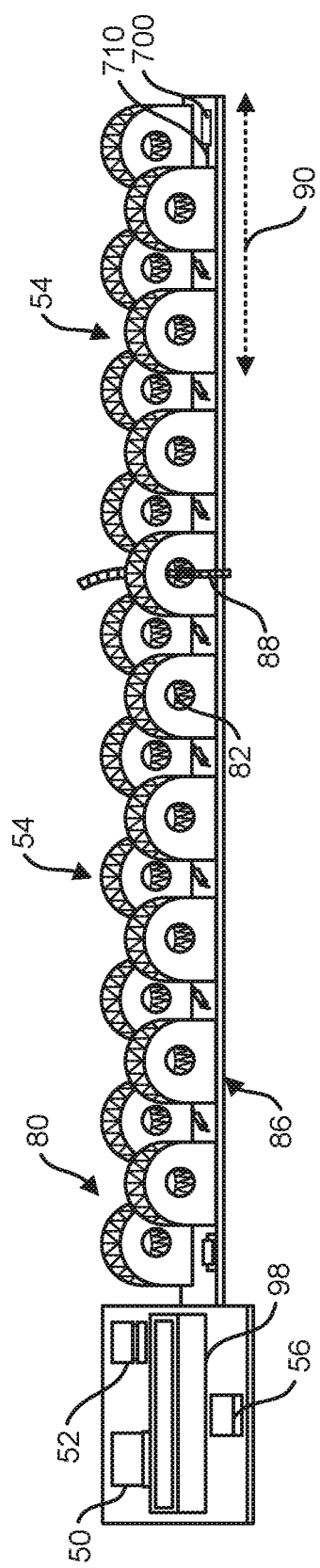
FIG. 7 illustrates a current transformer strip for a branch current monitor with a temperature sensor.

Referring to FIG. 7, the set of current sensors arranged along the elongate support may further include a temperature sensor 700 supported by the elongate support or otherwise connected to the elongate support. The temperature sensor 700 may provide an output 710, either digital or analog, that indicates the temperature in the vicinity of the current sensors. The temperature sensor may be supported by or enclosed within a housing of the current sensor. The temperature sensor output 710 may be provided to the data processing unit for further processing or other suitable location.

Figure 8:
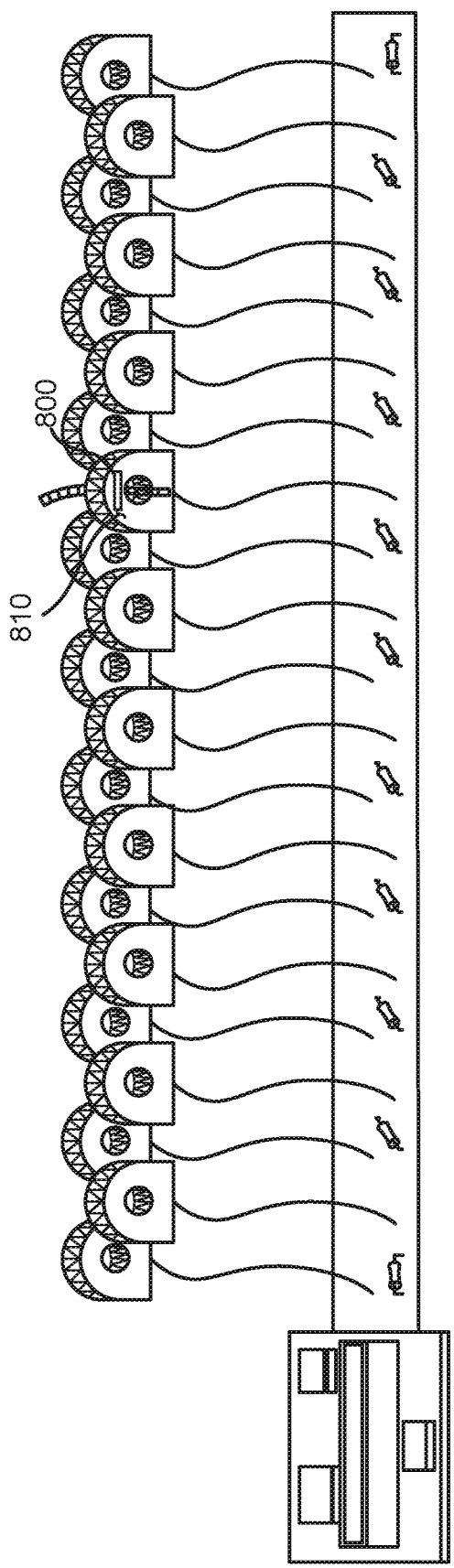
FIG. 8 illustrates a current transformer strip for a branch current monitor.

Referring to FIG. 8, in another embodiment a temperature sensor 800 is supported by or enclosed within a housing enclosing the current sensor, which is in turn connected to the elongate support. The temperature sensor 800 may provide an output 810, either digital or analog, that indicates the temperature in the vicinity of the current sensors. The temperature sensor may be supported by or otherwise connected to the elongate support. The temperature sensor output 810 may be provided to the data processing unit for further processing or other suitable location.

In general, the temperature sensor may be associated with the current sensor(s) and/or the power cable(s), which are likewise in turn associated with the other of the current sensor(s) and/or the power cable(s) which are associated with one or more circuit breakers.

Figure 9:
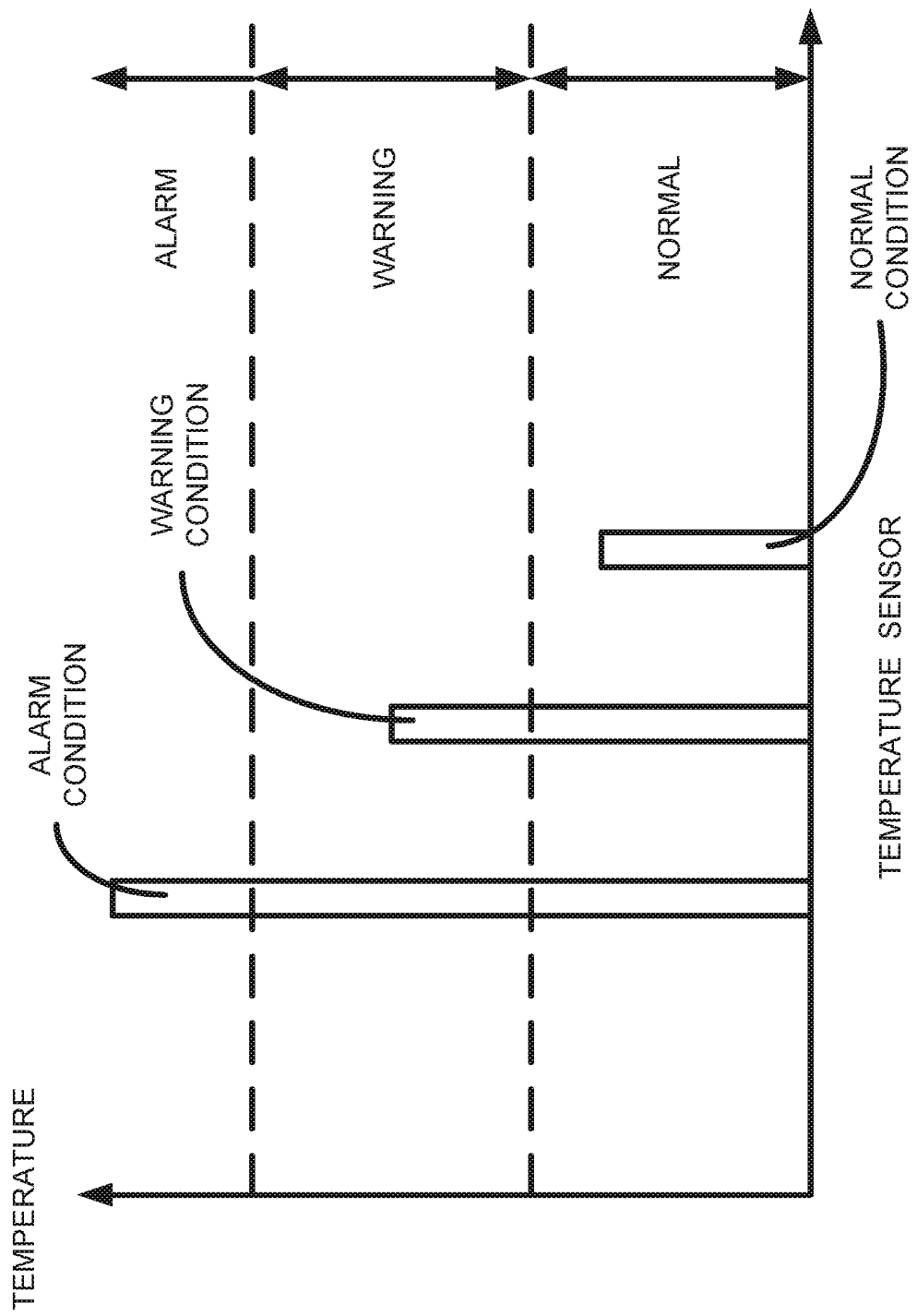
FIG. 9 illustrates normal, warning, and alarm conditions based upon the temperature sensor.

Referring to FIG. 9, a temperature threshold alarm level may be determined, which may be an absolute temperature threshold. When the temperature rises above the temperature threshold an alarm condition is triggered. The alarm condition may provide a signal to a control panel, or otherwise, so that the circuit breakers of the particular panel associated with the current sensors may be checked to ensure that all connections are sufficiently secure. In this manner, inadvertent tripping of the circuit breakers may be alleviated as a result of loose electrical connections. When the temperature rises above the lower temperature threshold a warning condition is triggered. The warning condition may provide a signal to a control panel, or otherwise, so that the circuit breakers of the particular panel associated with the current sensors may be checked to ensure that all connections are sufficiently secure. In this manner, inadvertent tripping of the circuit breakers may be alleviated as a result of loose electrical connections.

Figure 10:
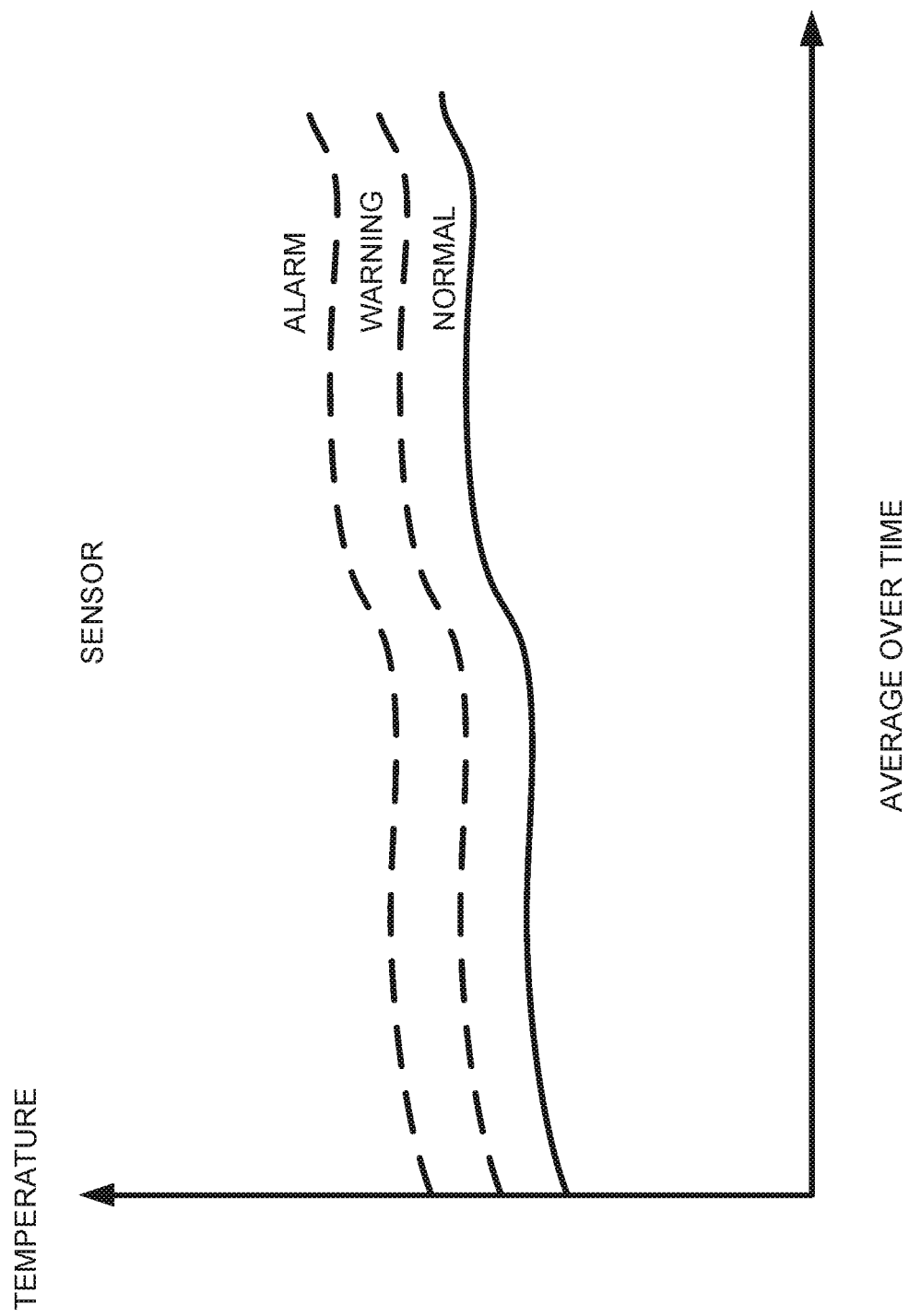
FIG. 10 illustrates temporal based normal, warning, and alarm conditions based upon the temperature sensor.

Referring to FIG. 10, a temperature threshold alarm level may be determined, which may be a relative temperature based upon a historical average temperature. By way of example, the temperature may be averaged over a period of 24 hours with a temperature sampling every 5 minutes, and when the current sensed temperature is 20 percent above the average temperature over the time period an alarm condition is triggered. When the temperature rises above the temperature threshold an alarm condition is triggered. The alarm condition may provide a signal to a control panel, or otherwise, so that the circuit breakers of the particular panel associated with the current sensors may be checked to ensure that all connections are sufficiently secure. When the temperature rises above the lower temperature threshold a warning condition is triggered. The warning condition may provide a signal to a control panel, or otherwise, so that the circuit breakers of the particular panel associated with the current sensors may be checked to ensure that all connections are sufficiently secure. In this manner, inadvertent tripping of the circuit breakers may be alleviated as a result of loose electrical connections. In this manner, inadvertent tripping of the circuit breakers may be alleviated as a result of loose electrical connections.

Figure 11:
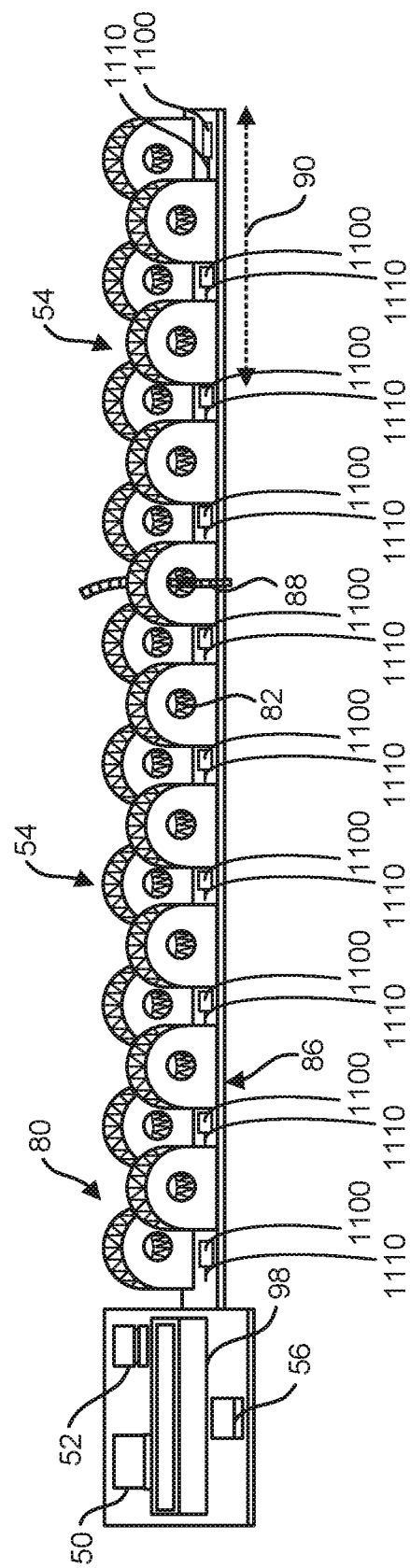
FIG. 11 illustrates a current transformer strip for a branch current monitor with a set of temperature sensors.

Referring to FIG. 11, the set of current sensors arranged along the elongate support may further include a set of spaced apart temperature sensors 1100 supported by the elongate support or otherwise connected to the elongate support. The temperature sensors 1100 may provide a respective output 1110, either digital or analog, that indicates the temperature in the vicinity of the respective current sensors. The temperature sensor may be supported by or enclosed within a housing of the current sensor. The temperature sensor output 1110 may be provided to the data processing unit for further processing or other suitable location.

Figure 12:
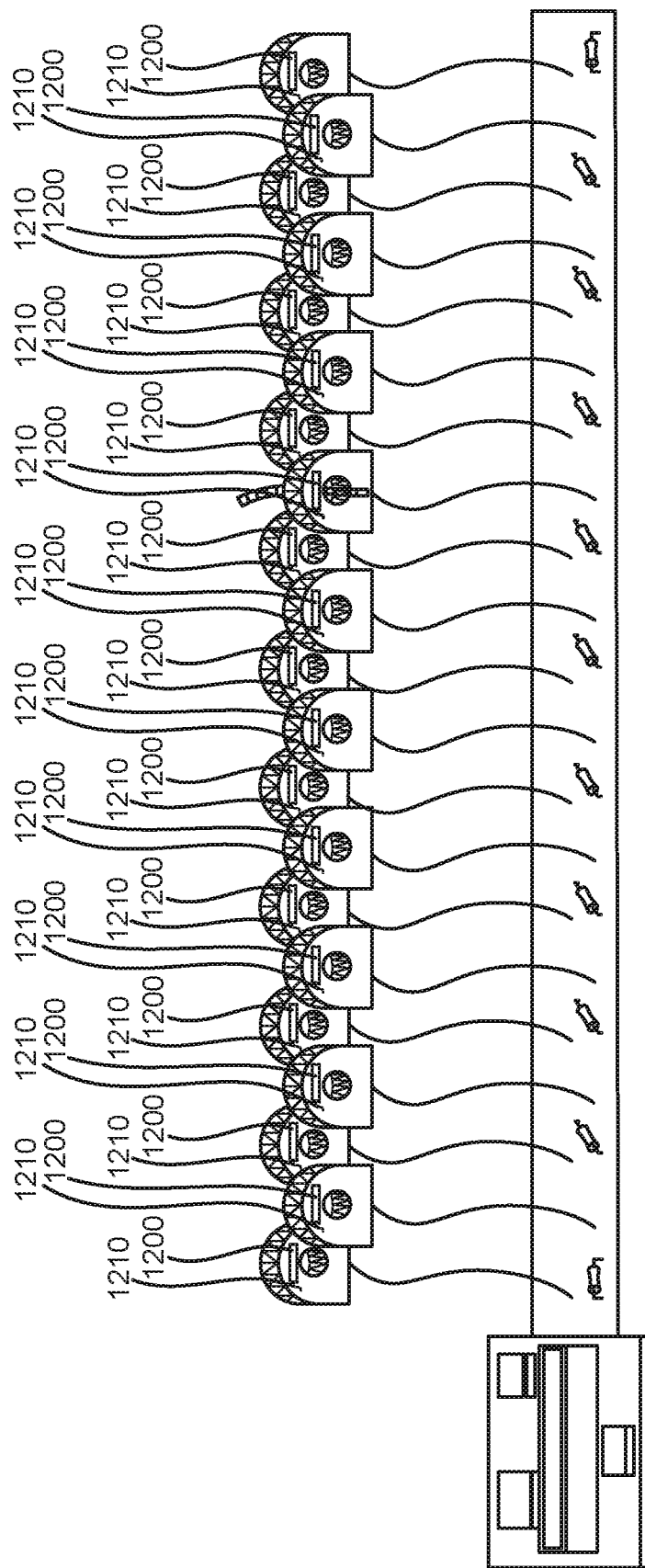
FIG. 12 illustrates a current transformer strip for a branch current monitor with a set of temperature sensors.

Referring to FIG. 12, in another embodiment temperature sensors 1200 are supported by and/or enclosed within a respective housing enclosing the respective current sensor, which are in turn connected to the elongate support. The temperature sensors 1200 may provide an output 1210, either digital or analog, that indicates the temperature in the vicinity of the respective current sensors. The temperature sensor may be supported by or otherwise connected to the elongate support. The temperature sensor output 1210 may be provided to the data processing unit for further processing of other suitable location.

Figure 13:
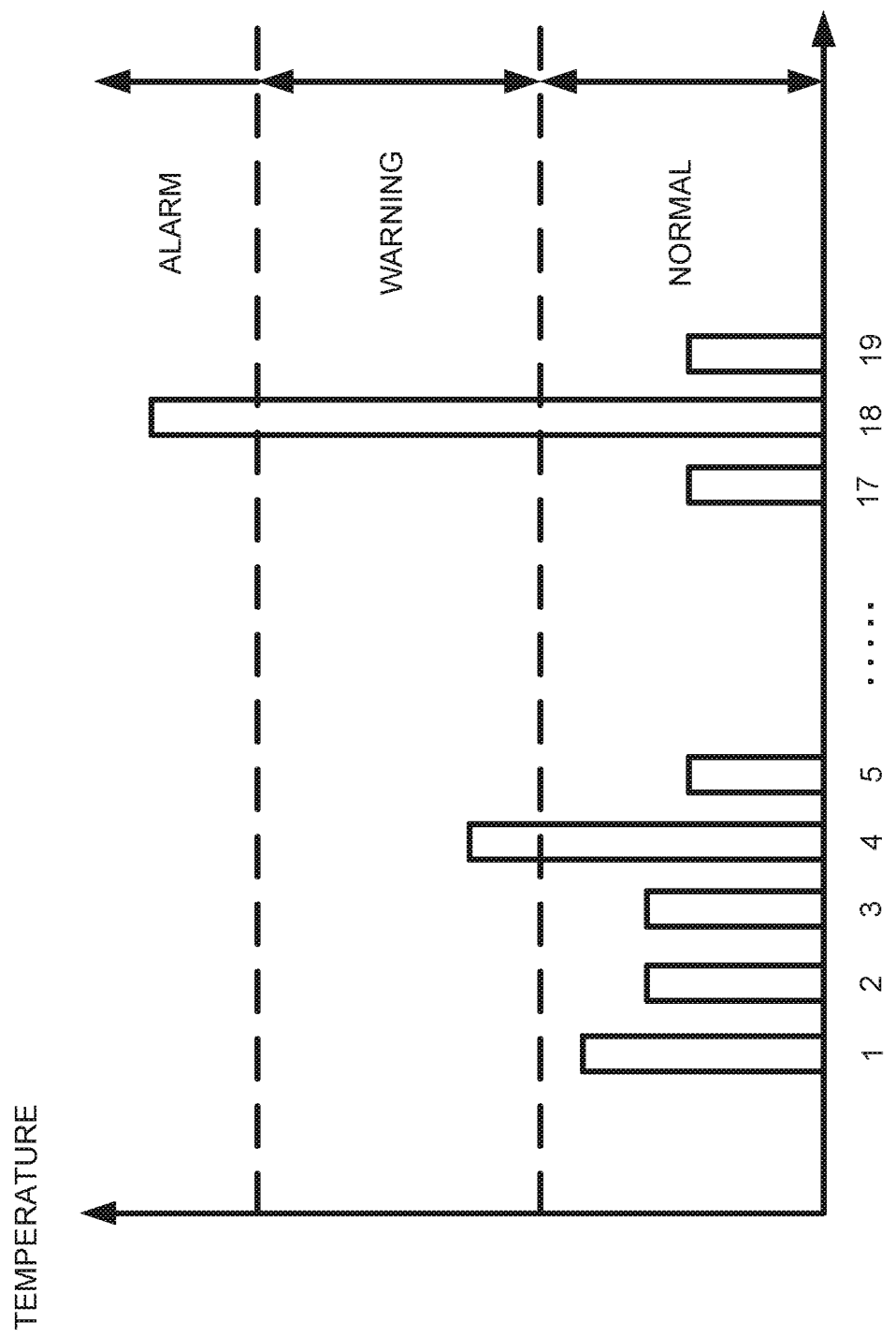
FIG. 13 illustrates normal, warning, and alarm conditions based upon the temperature sensors.

Referring to FIG. 13, a temperature threshold alarm level may be determined for each temperature sensor, which may be an absolute temperature threshold of one or more of the temperature sensors. When the temperature rises above the temperature threshold an alarm condition is triggered. The alarm condition may provide a signal to a control panel, or otherwise, so that the circuit breakers of the particular panel associated with the current sensors may be checked to ensure that all connections are sufficiently secure. A warning condition may also be provided. In this manner, inadvertent tripping of the circuit breakers may be alleviated as a result of loose electrical connections.

Figure 14:
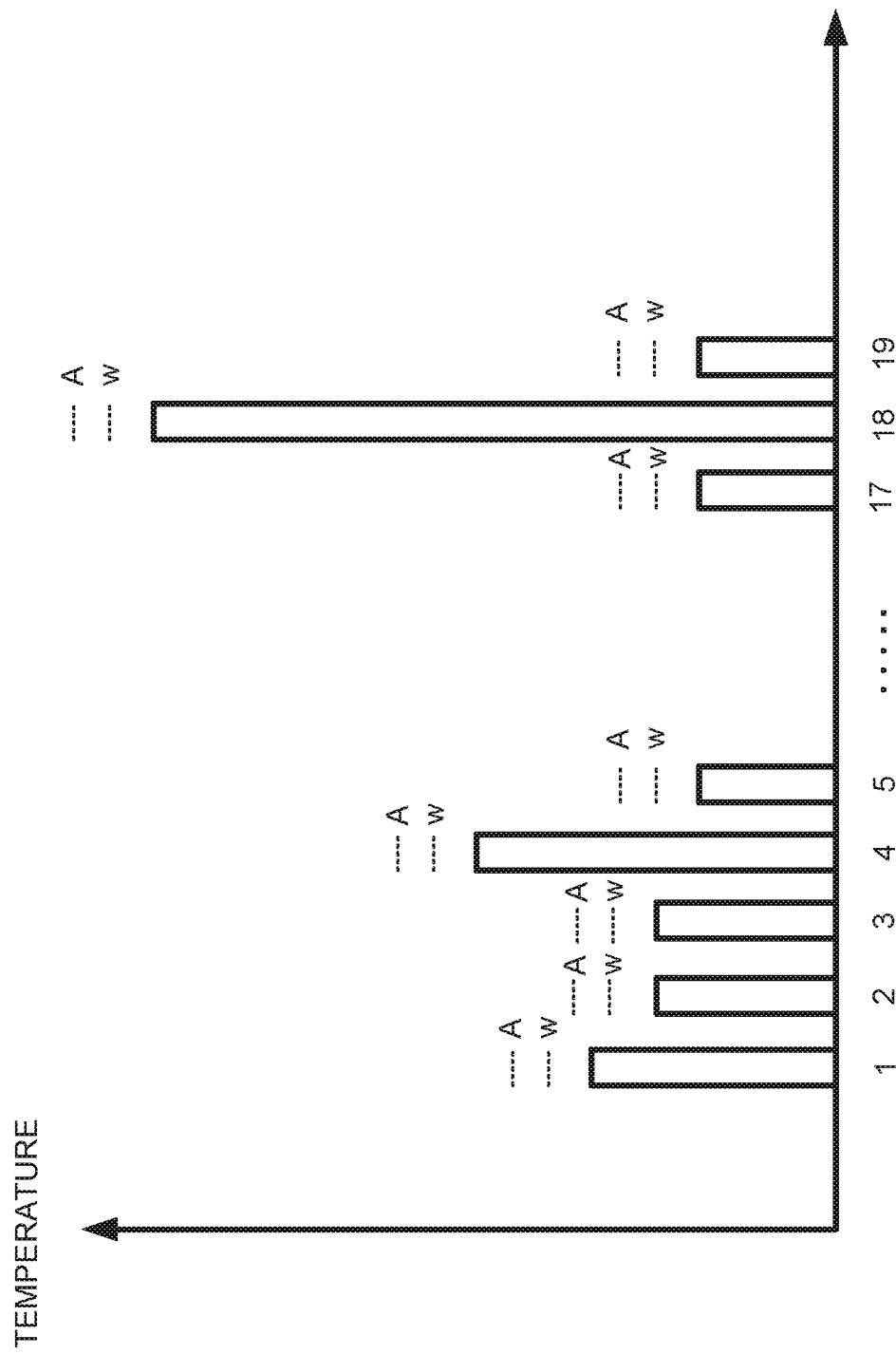
FIG. 14 illustrates temporal based normal, warning, and alarm conditions based upon the temperature sensors.

Referring to FIG. 14, a temperature threshold alarm level may be determined for each temperature sensor, which may be a relative temperature based upon a historical average temperature of one or more of the temperature sensors. By way of example, the temperature of all the current sensors may be averaged over a period of 24 hours with a temperature sampling every 5 minutes, and when the current sensed temperature is 20 percent above the average temperature over the time period an alarm condition is triggered. When the temperature rises above the temperature threshold an alarm condition is triggered. The alarm condition may provide a signal to a control panel, or otherwise, so that the circuit breakers of the particular panel associated with the current sensors may be checked to ensure that all connections are sufficiently secure. A arning condition may also be provided. In this manner, inadvertent tripping of the circuit breakers may be alleviated as a result of loose electrical connections.

Figure 15:
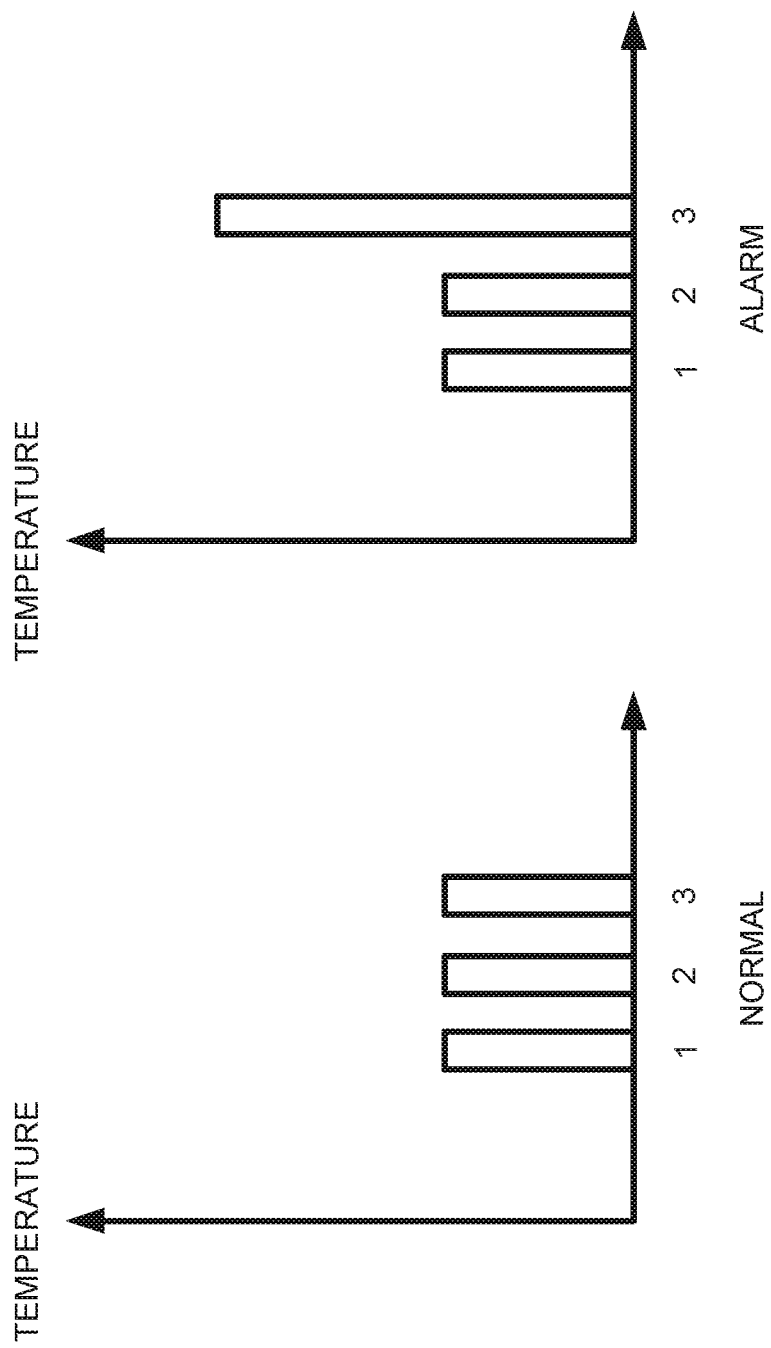
FIG. 15 illustrates multi-phase based normal, arning, and alarm conditions based upon temperature sensors.

Referring to FIG. 15, in some cases a temperature sensor may be associated with each phase of a multi-phase (e.g., two phase and/or three phase) circuit. In this case, it would be expected that under normal operating conditions that the temperature sensed for each of the phases would be substantially the same. In the event that one or more of the temperatures sensed of a multi-phase circuit is substantially greater than one or more of the other phases, then an alarm condition may be triggered. By way of example, the difference may be 20% or more.

In an alternative embodiment, one or more of the temperature sensors may be associated with one or more of the current sensors.

Figure 16:
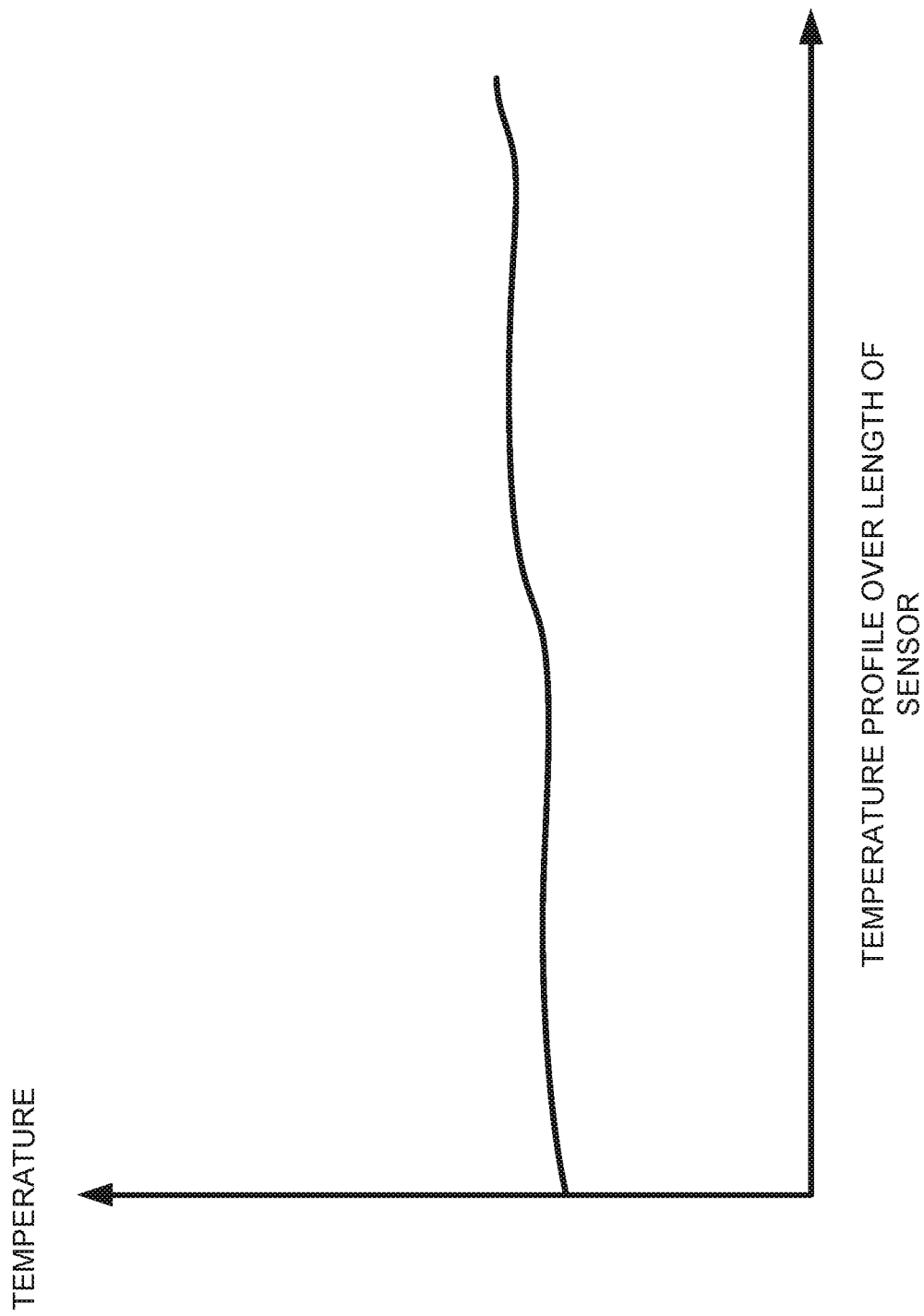
FIG. 16 illustrates spatial based normal, warning, and alarm conditions based upon the temperature sensors.

Referring to FIG. 16, with a plurality of spaced apart temperature sensors a two dimensional profile may be determined for the temperature sensors. It would be expected that the temperature associated with each of the temperature sensors are relatively consistent with one another. When the temperature associated with one or more of the temperature sensors is sufficiently different than the other current sensors, then those circuit breakers associated with the temperature sensors having sufficiently different values may be identified as being a potential loose connection. Also, the profile may be used to determine false negatives from the temperature sensors. If one temperature sensor indicates a heightened temperature level, but one or more other proximate temperature sensors do not indicate a heightened temperature level, the heightened temperature level sensor may be ignored as a false positive or otherwise a warning may be indicated which may have a lower severity level than an alarm.

The alarm condition and/or the warning condition may further be based upon a combination of the output of one or more of the temperature sensors together with the output of one or more of the current sensors.

In some situations, the temperature variations may be based upon a change in the voltage levels being provided to a particular load. By way of example, the loose connection between the power cable and the circuit breaker may result in undesirable variations in the voltage levels. While a contact based voltage sensor may be provided far each of the power cables, it is preferable that one or more non-contact voltage sensors are supported by or connected to the elongate circuit board. Also, a non-contact voltage sensor may be supported by or enclosed within a respective housing for a current sensor. The non-contact voltage sensor preferably senses a voltage level within a respective power conductor. The output of one or more of the temperature sensors may be associated with one or more of the outputs of the current sensors and/or one or more output of the non-contact voltage sensors to determine a warning condition and/or an alarm condition for one or more of the circuit breakers and/or loads.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. An energy system comprising:
   (a) a plurality of at least three current sensors, suitable to sense a changing current in a respective power cable, that provide a respective first output;
   (b) an elongate support;
   (c) said at least three current sensors interconnected to said elongate support at a set of spaced apart locations along said elongate support that is consistent with spacing of a uniformly spaced apart set of at least three power cables each of which is interconnected to a respective one of a uniformly spaced apart set of at least three circuit breakers of a power panel;
   (d) at least three temperature sensors that provides each provide a respective second output;
   (e) each of said temperature sensors interconnected to said elongate support at a set of spaced apart locations along said elongate support;
   (f) said energy system that receives said respective first output from said at least three current sensors and said respective second output from each of said at least three temperature sensors, and (1) determines characteristics of said energy system based upon a plurality of said second outputs to identify one of said at least three circuit breakers that is likely to trip and (2) determines characteristics of said energy system based upon said plurality of said second outputs to identify another one of said at least three circuit breakers that is not likely to trip, while said one of said at least three circuit breakers is identified as said likely to trip.

2. The energy system of claim 1 wherein said current sensors are detachably interconnected to said support.

3. The energy system of claim 1 wherein said current sensors are detachably interconnected to said support by a respective connector.

4. The energy system of claim 1 wherein said temperature sensors are supported by an enclosure where said enclosure encloses one of said plurality of current sensors.

5. The energy system of claim 4 wherein said temperature sensors are enclosed within said enclosure.

6. The energy system of claim 1 wherein said characteristics are used to predict if a circuit breaker associated with a respective power cable is likely to trip.

7. The energy system of claim 1 wherein said characteristics are used to predict if one of a plurality of circuit breakers associated with a plurality of respective power cables is likely to trip.

8. The energy system of claim 1 wherein said characteristics are used to provide an alarm condition.

9. The energy system of claim 1 wherein said characteristics are used to provide a warning condition.

10. The energy system of claim 1 wherein said characteristics are used to provide a normal condition.

11. The energy system of claim 8 wherein said alarm condition is based upon a plurality of said second outputs.

12. The energy system of claim 9 wherein said warning condition is based upon a plurality of said second outputs.

13. The energy system of claim 10 wherein said normal condition is based upon a plurality of said second outputs.

14. The energy system of claim 8 wherein said alarm condition is based upon a relative level of said characteristics.

15. The energy system of claim 8 wherein said alarm condition is based upon an absolute level of said characteristics.

16. The energy system of claim 1 wherein said temperature sensors are supported by said support.

17. The energy system of claim 1 further comprising said plurality of said temperature sensors, each of which is supported directly by said support.

18. The energy system of claim 1 further comprising a plurality of enclosures each of which is associated with a respective current sensor, each of said temperature sensors are supported by a respective said enclosure and each of which provides a respective said second signal.

19. The energy system of claim 1 further comprising each of said plurality of said temperature sensors each of which having a respective said second output wherein said characteristics for one of said power cables is determined based upon a plurality of said respective second outputs.

20. The energy system of claim 1 wherein said plurality of current sensors includes three current sensors, suitable to sense a changing current in a respective power cable of a three phase load, that provide a respective first output, three said temperature sensors each of which having a respective said second output, wherein a first one of said respective said first outputs is associated with a respective first one of said second outputs, wherein a second one of said respective said first outputs is associated with a second respective one of said second outputs, wherein a third one of said respective said first outputs is associated with a third respective one of said second outputs, wherein said characteristics for said load is based upon said three said respective said second outputs.

* * * * *